United States Patent
Yoshida et al.

(10) Patent No.: US 8,619,829 B2
(45) Date of Patent: Dec. 31, 2013

(54) SEMICONDUCTOR LASER DEVICE

(75) Inventors: Yuta Yoshida, Miyagi (JP); Sachio Karino, Miyagi (JP); Takahiro Yokoyama, Miyagi (JP); Makoto Nakashima, Miyagi (JP); Eiji Takase, Miyagi (JP)

(73) Assignee: Sony Corporation, Tokyo (JP)

( * ) Notice: Subject to any disclaimer, the term of this patent is extended or adjusted under 35 U.S.C. 154(b) by 359 days.

(21) Appl. No.: 12/813,235

(22) Filed: Jun. 10, 2010

(65) Prior Publication Data

US 2011/0002354 A1    Jan. 6, 2011

(30) Foreign Application Priority Data

Jul. 3, 2009 (JP) ................. 2009-159041

(51) Int. Cl.
*H01S 5/00* (2006.01)

(52) U.S. Cl.
USPC .............. 372/46.012; 372/38.05; 372/50.122; 372/87

(58) Field of Classification Search
USPC .............. 372/38.05, 87, 50.122, 46.012
See application file for complete search history.

(56) References Cited

U.S. PATENT DOCUMENTS

| | | |
|---|---|---|
| 6,444,998 B1 | 9/2002 | Taniguchi et al. |
| 6,516,017 B1 * | 2/2003 | Matsumoto ................ 372/50.11 |

FOREIGN PATENT DOCUMENTS

| | | |
|---|---|---|
| JP | 2000-021785 | 1/2000 |
| JP | 2000-269601 | 9/2000 |
| JP | 2001-144367 | 5/2001 |
| JP | 2002-344084 | 11/2002 |
| JP | 2009-004473 | 1/2009 |

OTHER PUBLICATIONS

Japanese Office Action issued in connection to related Japanese Patent Application No. JP 2009-159041 dated Sep. 10, 2013.

* cited by examiner

*Primary Examiner* — Xinning Niu
(74) *Attorney, Agent, or Firm* — Dentons US LLP

(57) ABSTRACT

The present invention provides a semiconductor laser device including: a plurality of light emitting sections arranged in strip shapes in parallel; a plurality of first electrodes arranged along top faces of the light emitting sections, respectively; an insulating film covering a whole surface of the plurality of first electrodes, and including contact apertures corresponding to the first electrodes, respectively; a plurality of second electrodes arranged in positions different from those of the plurality of light emitting sections, correspondingly to the first electrodes; a plurality of wiring layers arranged on the insulating layer, and electrically connecting the second electrodes and the corresponding first electrodes through the contact apertures, respectively; and a plurality of window regions arranged for the light emitting sections in the insulating film so as to expose the first electrodes, respectively, and including at least two window regions having areas different from each other.

9 Claims, 10 Drawing Sheets

SEMICONDUCTOR LASER DEVICE

BACKGROUND OF THE INVENTION

1. Field of the Invention

The present invention relates to a multi-beam semiconductor laser device including a plurality of light emitting sections, and particularly relates to a semiconductor laser device having a junction up mount configuration.

2. Description of the Related Art

From the past, the semiconductor laser device of this type has been used in an electric device such as a laser beam printer. In the semiconductor laser device, on a plurality of strip-shaped ridges in which light emitting sections (emitters) are formed, strip-shaped electrodes (upper electrodes) are provided, respectively. Pad electrodes for external extraction are electrically connected to the strip-shaped electrodes, respectively. Further, an isolating groove is provided between the emitters adjacent to each other, and each emitter is independently driven (for example, Japanese Unexamined Patent Publication No. 2000-269601). In such a multi-beam laser device, with size reduction of the device in recent years, a beam pitch is a narrow pitch of approximately several tens of μm.

FIG. 11 illustrates the planar structure of such a multi-beam laser device of the narrow pitch type. This multi-beam laser device is manufactured in the following procedures. That is, after a plurality of strip-shaped ridges 101 including emitters are formed on a substrate 100, upper electrodes 102 are formed on the ridges 101 through the use of evaporation method, respectively. Next, after electrically isolating between the emitters by forming isolating grooves 103 between these ridges 101, respectively, the whole surface is once covered with an insulating film 104. After that, contact windows 105 corresponding to the upper electrodes 102, respectively, are formed in the insulating film 104. As illustrated in FIG. 11, there is a case where this contact window 105 is formed only immediately below a wiring layer 106, or there is a case where the contact window 105 is formed to have a heat release region larger than the region immediately below the wiring layer 106. For the purpose of electrically connecting the upper electrode 102, and the wiring layer 106 and the pad electrode 107, the plurality of contact windows 105 are manufactured in uniform size with respect to each emitter.

SUMMARY OF THE INVENTION

However, in the multi-beam laser device of the narrow pitch type described above, in the case where light emission is performed in the plurality of emitters at the same time, each beam is influenced by heat from other beams. Therefore, in particular, the temperature of the beam in the middle part becomes higher than the temperatures of the beams at both ends, and the wavelength is elongated. That is, there is an issue that the difference of the magnitude of an oscillation wavelength is generated among the plurality of beams.

Further, such an issue of the wavelength elongation is generated also in a multi-beam laser device formed on a structure substrate. That is, even in a semiconductor laser having an SDH structure (separated double heterostructure) (for example, Japanese Unexamined Patent Publication No. Hei 12-021785), the difference of the magnitude of the oscillation wavelength is generated among the plurality of beams. However, on the contrary to the case of the narrow pitch type, there is an issue that the wavelengths of the beams at the both ends are elongated in the SDH structure. The semiconductor laser having the SDH structure is manufactured by utilizing the (111)B plane which appears when a semiconductor layer is grown, and there is a tendency that the width and the height of an active layer is different between the emitters in the middle, and the emitters at the both ends. Thus, it is thought that the oscillation wavelength gradually becomes long from the emitters in the middle toward the emitters at the both ends.

In this manner, in the multi-beam semiconductor laser device of the past, it is difficult to obtain a predetermined oscillation wavelength because of the mutual influence among the beams caused by the narrow pitch, and the structural matter. Thus, there is an issue that it is difficult to obtain the wavelengths which are uniform over the whole multi-beam.

In view of the foregoing, it is desirable to provide a semiconductor laser device capable of obtaining a predetermined oscillation wavelength in each light emitting section, while suppressing wavelength elongation caused by a narrow pitch and a structural matter.

According to an embodiment of the present invention, there is provided a semiconductor laser device including the following elements A to F:

A: a plurality of light emitting sections arranged in strip shapes in parallel, and emitting beams from end faces in an extending direction;

B: a plurality of first electrodes arranged along top faces of the light emitting sections, respectively;

C: an insulating film covering a whole surface of the plurality of first electrodes, and including contact apertures corresponding to the first electrodes, respectively;

D: a plurality of second electrodes arranged in positions different from those of the plurality of light emitting sections, correspondingly to the first electrodes;

E: a plurality of wiring layers arranged on the insulating layer, and electrically connecting the second electrodes and the corresponding first electrodes through the contact apertures, respectively; and F: a plurality of window regions arranged for the light emitting sections in the insulating film so as to expose the first electrodes, respectively, and including at least two window regions having areas different from each other.

More specifically, in the semiconductor laser device according to the embodiment of the present invention which has a structure in which three or more of the light emitting sections (emitters) are arranged in parallel, the areas of the window regions are relatively wide in the light emitting sections in middle, and are relatively narrow in the light emitting sections at both end sides in the plurality of light emitting sections, or the areas of the window regions are relatively narrow in the light emitting sections at the both end sides, and are relatively wide in the light emitting sections in the middle in the plurality of light emitting sections. In the case where a laser structure is formed on a structure substrate having an SDH structure, the areas of the window regions are preferably set as described in the former. In the case where the laser structure is formed on a typical substrate, and pitches are narrow, the areas of the window regions are preferably set as described in the latter. In addition, the expression "narrow pitch" denotes the beam pitch of approximately several tens of μm or less.

In the semiconductor laser device according to the embodiment of the present invention, the areas of the window regions for heat release are varied corresponding to the positions of the plurality of light emitting sections arranged in parallel (for example, relatively wide in the middle part and narrow at both ends, or the other way around), and thereby a heat release function in each light emitting section is controlled. Thus, the wavelength elongation is suppressed.

According to the semiconductor laser device of the embodiment of the present invention, the window regions for heat release are provided in the insulating film on upper electrodes, correspondingly to the light emitting sections, respectively, and at least two regions in the widow regions have areas different from each other. Thereby, the heat release function in each light emitting section may be controlled. Thus, it is possible to obtain a predetermined oscillation wavelength in each light emitting section while suppressing the wavelength elongation of the beam, and it is possible to uniformize the oscillation wavelengths over all the beams.

Other and further objects, features and advantages of the invention will appear more fully from the following description.

DETAILED DESCRIPTION OF THE PREFERRED EMBODIMENT

Figure 1:
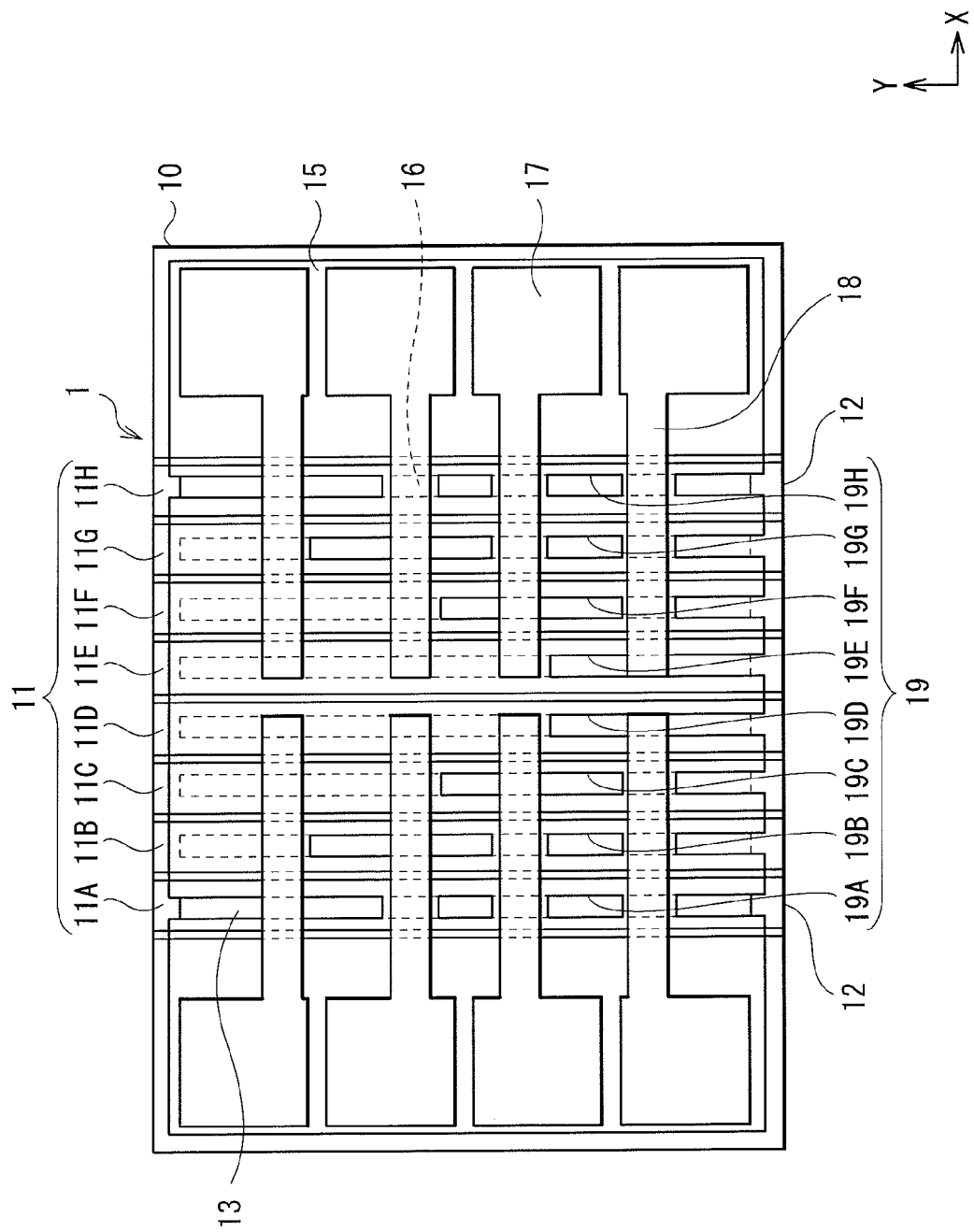
FIG. 1 is a plan view of a semiconductor laser device according to a first embodiment of the present invention.

Embodiments of the present invention will be hereinafter described in detail with reference to the drawings. The description will be made in the following order:
1. First embodiment: an example of a multi-beam laser device having an SDH structure
2. First modification: a modification of a pattern of a window region
3. Second modification: a modification of a pattern of a wiring layer
4. Second embodiment: an example of another multi-beam laser device
5. Third modification

1. First Embodiment

FIG. 1 illustrates an example of the planar structure of a semiconductor laser device 1 according to a first embodiment of the present invention. The semiconductor laser device 1 is an edge-emitting multi-beam semiconductor laser device having the SDH structure.

The semiconductor laser device 1 includes a laser structure in each of ridges 11 of a structure substrate 10. The structure substrate 10 includes a plurality of (here, eight as an example) ridges 11 (11A to 11H). In FIG. 1, the ridges 11A to 11H extend in strip shapes in the y-axis direction, and are arranged in parallel to each other. In the ridges 11A to 11H, light emitting sections (emitters) 12 are provided, respectively, and each of the light emitting sections 12 emits a laser beam from its end face in the extending direction.

Figure 5:
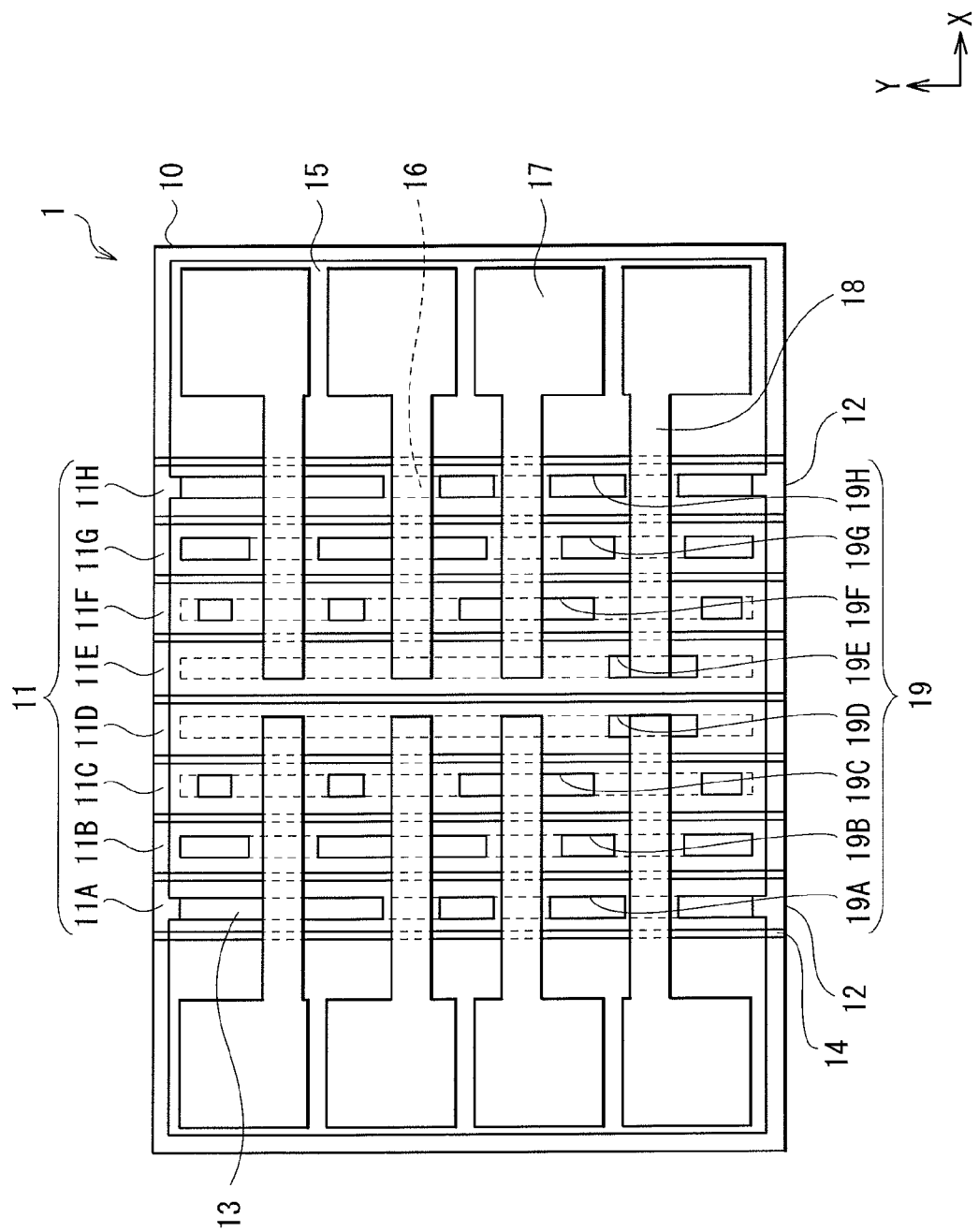
FIG. 5 is a plan view according to a first modification.

On the top face of each of the ridges 11, an upper electrode 13 (first electrode) is provided. The upper electrode 13 corresponds to one electrode (here, an n-side electrode) of a pair of electrodes (a p-side electrode and the n-side electrode) with respect to the light emitting section 12. The ridges 11A to 11H are isolated from each other by isolating grooves 14 (FIG. 5). Here, in the eight ridges 11, for example, the two ridges 11D and 11E correspond to "ridges in the middle", and the ridges 11A and 11H correspond to "ridges at both ends", respectively.

Figure 2:
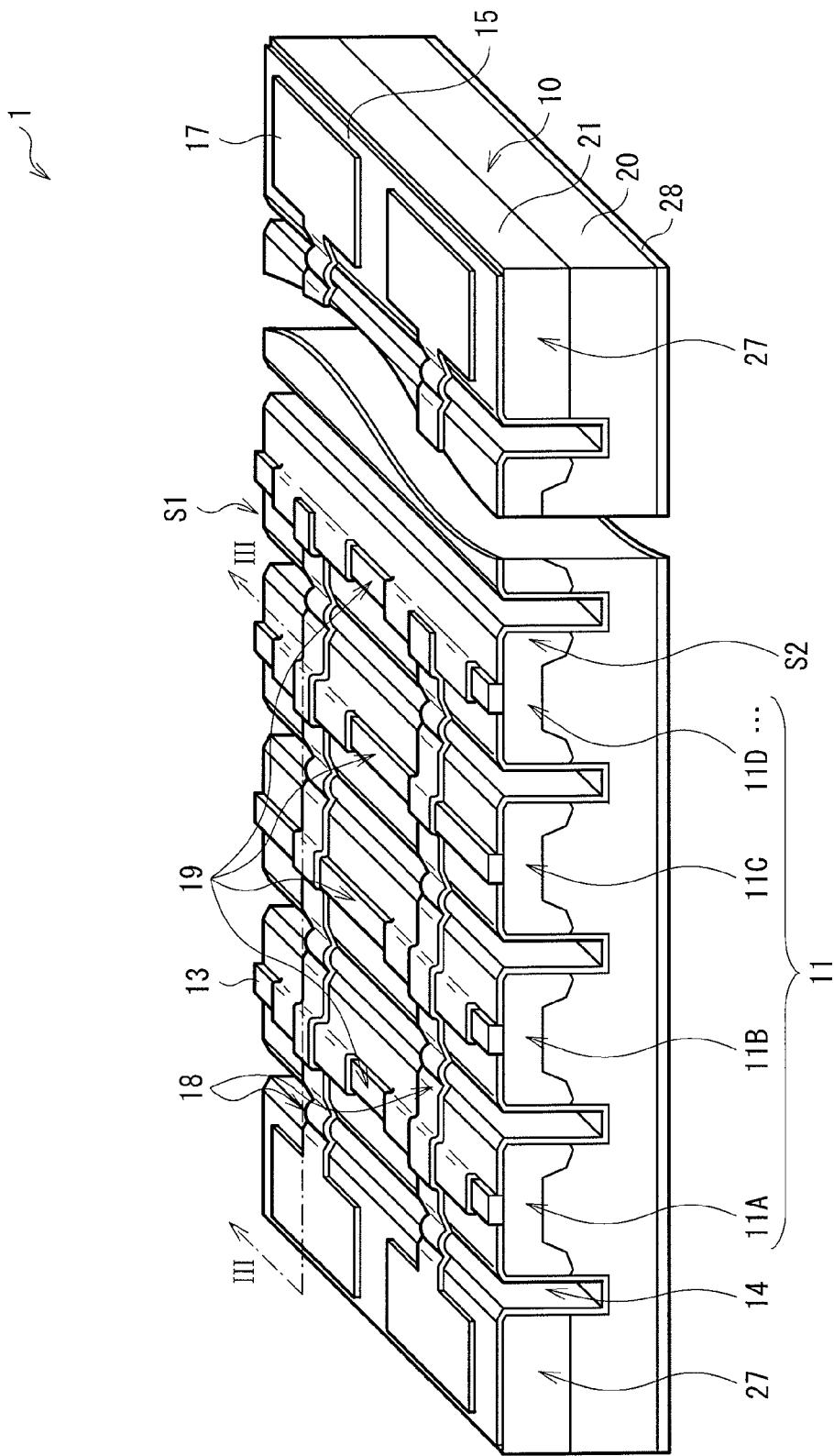
FIG. 2 is a perspective view illustrating a part of the semiconductor laser device of FIG. 1.

The upper electrodes 13 are covered with an insulating film 15. In the positions facing the upper electrodes 13 in the insulating film 15, contact apertures 16 are provided, respectively. The contact apertures 16 are intended to make the electrical connection between wiring layers 18 which will be described later, and the upper electrodes 13. At both ends of the surface of the structure substrate 10, a pair of four pad electrodes 17 (second electrodes) in parallel, that is, a total of the eight pad electrodes 17 are aligned in the extending direction of the ridges 11 with the plurality of ridges 11 and the isolating grooves 14 in between. On the insulating film 15, correspondingly to the pad electrodes 17, the plurality of wiring layers 18 are aligned in the direction orthogonal to the upper electrodes 13, respectively. By the wiring layers 18, the upper electrodes 13, and the pad electrodes 17 corresponding to the upper electrodes 13 are electrically connected. The wiring layers 18 are bridged above the isolating grooves 14 as will be described later (FIG. 2). The wiring layers 18 and the upper electrodes 13 are in contact with each other through the contact apertures 16 which are provided in the insulating film 15.

In the insulating film 15, a plurality of window regions 19 (19A to 19H) are provided for the ridges 11, respectively, so as to face the upper electrodes 13. In the window regions 19, the window regions 19D and 19E of the ridges 11D and 11E in the middle are relatively narrow, and the window regions 19A and 19H of the ridges 11A and 11H at the both ends are relatively wide. Further, the area of the window region 19 is sequentially increased in steps from the ridges 11 in the middle toward the ridges 11 at the both ends. The area of each of the window regions 19A to 19H depends on the total area of a plurality of window patterns provided for each ridge 11. In addition, although the contact aperture 16 is formed as an aperture pattern which is integrated with the window region 19 in this embodiment, it is possible to form the contact aperture 16 and the window region 19 separately from each other without being integrated with each other.

As described above, in the semiconductor laser having the SDH structure, there is a tendency that the width and the height of the active layer are varied between the emitters in the middle, and the emitters at the both ends. The reason for this may be considered as follows. In the laser having the SHD structure, since the (111)B plane is not crystal-grown, there are characteristics that a material supplied to the (111)B plane is migrated onto the (100) plane on the ridge, and the growth rate of the top face of the ridge becomes fast. In the ridges 11D and 11E in the middle, since the same laser structures are existed on both sides, the region of the (111)B plane is large, and the growth rate of the top face of the ridge becomes fast correspondingly. On the other hand, in the ridges 11A and 11H at the both ends, since the same laser structure is existed only on one side, the region of the (111)B plane is small, and thus the growth rate of the top face of the ridge is slow. From these, the widths of the active layers of the emitters in the middle are relatively narrow, and the thicknesses are thick. That is, the widths and the heights of the active layers of the emitters in the middle are different from those of the active layers of the emitters at the both ends. As a result, it is presumed that the oscillation wavelengths of the emitters at the both ends are elongated in comparison with those of the emitters in the middle.

Figure 3:
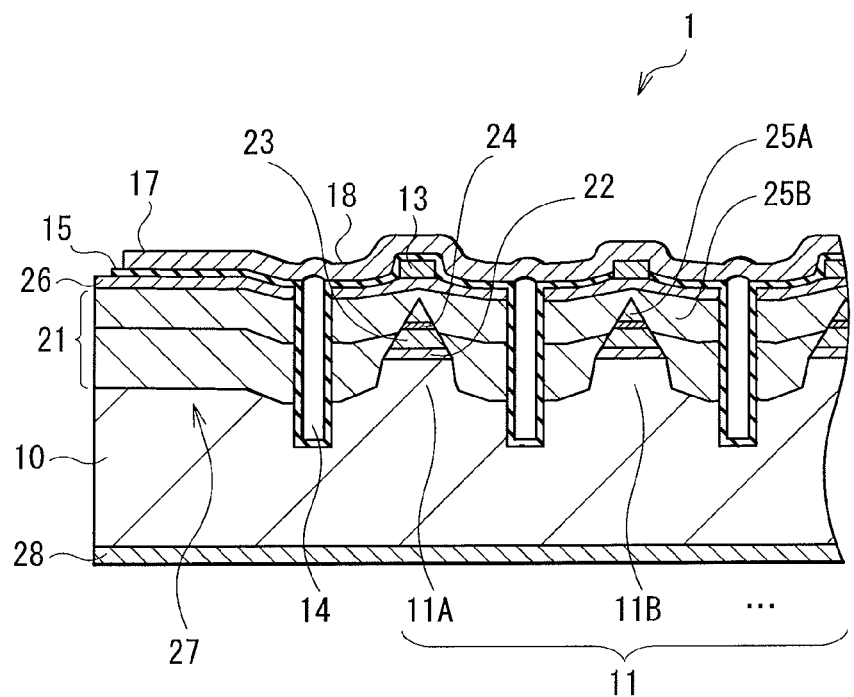
FIG. 3 is a view illustrating the cross-sectional structure along line III-III of FIG. 2.

FIG. 2 perspectively illustrates an example of the schematic structure of the semiconductor laser device 1, and FIG. 3 illustrates the cross-sectional structure along line III-III of FIG. 1. Here, only two rows in the middle in the y-axis direction of FIG. 1 is illustrated for the sake of simplification. The structure substrate 10 includes the ridges 11 (11A to 11H) on one main face of a p-type GaAs substrate 20 which has the (100) plane orientation. The ridges 11A to 11H extend in the [011] direction. These strip-shaped ridges 11A to 11H are formed, for example, by forming a strip-shaped (stripe) resist pattern having a predetermined width and extending in the [011] direction on the GaAs substrate 20, and then performing wet etching on the GaAs substrate 20 through the use of the resist pattern as a mask.

A semiconductor layer 21 is provided on the structure substrate 10, and the semiconductor layer 21 includes the light emitting section 12 for each of the ridges 11A to 11H. The semiconductor layer 21 includes, for example, a buffer layer 22, a cladding layer 23, an active layer 24, cladding layers 25A and 25B, and a contact layer 26 in this order, which are deposited through the use of MOCVD (metal organic vapor deposition) method. For example, the buffer layer 22 is composed of p-type GaAs, the cladding layer 23 is composed of p-type AlGaAs, the active layer 24 is composed of AlGaAs, the cladding layers 25A and 25B are composed of n-type AlGaAs, and the contact layer 26 is composed of n-type GaAs, respectively. Examples of the p-type impurity include magnesium (Mg) or zinc (Zn), and examples of the n-type impurity include silicon (Si) or selenium (Se). Although not illustrated in the figure, for example, on a side face of each of the ridges 11A to 11H, a current blocking layer including a p-type AlGaAs layer, an n-type AlGaAs layer, and a p-type AlGaAs layer is provided.

At both ends in the alignment direction of the ridges 11, strip-shaped pedestals 27 having the heights equal to those of the ridges 11 are provided. On the pedestal 27, the above-described pad electrode 17 is provided. The isolating groove 14 reaches the top part of the structure substrate 10, and thereby the semiconductor layer 21 is spatially divided into a plurality of parts by the isolating groove 14. In addition, the isolating groove 14 does not reach the top part of the structure substrate 10, and the semiconductor layer 21 may not completely spatially divided by the isolating groove 14. Alternatively, the isolating groove 14 may be filled with an insulating material.

The width (width in the direction orthogonal to the extending direction of the isolating groove 14) of the isolating groove 14 is narrower than the width (width of the direction orthogonal to the extending direction (resonator direction) of the ridge 11) of the ridge 11.

In each ridge 11, a pair of a front end face S1 and a rear end face S2 are formed so as to sandwich the ridge 11 from the extending direction of the ridge 11, and a resonator is composed of the front end face S1 and the rear end face S2. The pair of the front end face S1 and the rear end face S2 are, for example, formed by cleaving, and are arranged so as to face each other with a predetermined gap in between.

Although the pad electrodes 17 are arranged on a line in the direction parallel to the ridges 11, the pad electrodes 17 may be alternately arranged (arranged in zigzag) in the extending direction of the ridges 11. The shape of the pad electrode 17 is arbitrary without being limited to a rectangle as illustrated in FIG. 1, and may be, for example, a circle, an ellipse, or a polygon such as a triangle.

On the rear face of the structure substrate 10, a lower electrode 28 is provided. The lower electrode 28 is formed over the whole rear face of the structure substrate 10, and is electrically connected to the structure substrate 10.

The upper electrode 13, the pad electrode 17, and the wiring layer 18 are, for example, composed by stacking an alloy of gold (Au) and germanium (Ge), nickel (Ni), and gold (Au) in this order from the structure substrate 10 side. The upper electrode 13, the pad electrode 17, and the wiring layer 18 may have a stacked structure of materials other than the materials described above. The upper electrode 13, the pad electrode 17, and the wiring layer 18 may be composed of the same materials, or may be composed of materials different from each other. The insulating film 15 is composed of, for example, SiN, $SiO_2$, SiON, $Al_2O_3$, or AlN. The lower electrode 28 is, for example, composed by stacking titanium (Ti), platinum (Pt), and gold (Au) in this order from the top face side of the ridge 11.

Next, with reference to FIGS. 1 to 3, an example of a method of manufacturing the semiconductor laser device 1 will be described while focusing on the formation process of the window region 19 in the insulating film 15.

First, on each ridge 11 of the structure substrate 10 having the strip-shaped ridges 11 (11A to 11H), the light emitting section 12 including the buffer layer 22, the cladding layer 23, the active layer 24, the cladding layers 25A and 25B, and the contact layer 26 is formed, and then the upper electrode 13 is formed on each of the ridges 11A to 11L through the use of evaporation method. Next, after electrically isolating between the emitters by forming the isolating groove 14 between the ridges 11, the insulating film 15 is, for example, formed on the whole surface through the use of evaporation method.

Next, for example, the contact aperture 16 for the contact of the upper electrode 13, and the wiring layer 18 is formed in the insulating film 15 through the use of etching by utilizing a resist mask, and the window regions 19 (19A to 19H) for heat release are formed at the same time. Here, in the window regions 19A to 19H, as described above, the window regions 19D and 19E of the ridges 11D and 11E in the middle are relatively narrow, and the window regions 19A and 19H of the ridges 11A and 11H at the both ends are relatively wide. After that, the metal layer made of the above-described material is formed on the whole surface through the use of evaporation method or the like, and the pad electrode 17 and the wiring layer 18 are formed by patterning the metal layer. Thereby, the upper electrode 13 is electrically connected to the pad electrode 17 through the wiring layer 18. Meanwhile, on the rear face of the structure substrate 10, the lower electrode 28 is formed. In this manner, the semiconductor laser device 1 of this embodiment is completed.

In the semiconductor laser device 1 of this embodiment, when a predetermined voltage is applied between the upper electrode 13 and the lower electrode 28 in each light emitting section 12, a current is injected into a current injection region (light emitting region) of the active layer 24, and thereby light emission is generated by recombination of an electron and a hole. This light is reflected by the pair of the front end face S1 and the rear end face S2, and the laser oscillation is generated at a predetermined wavelength. The light is emitted outside as a laser beam from the front end face S1 of each light emitting section 12.

Here, in this embodiment, the area of the window region 19 provided for heat release in the insulating film 15 is relatively narrow in the ridges 11D and 11E in the middle, and is wide in the ridges 11A and 11H at the both ends. Correspondingly, the area of the window region is changed in steps in the ridges 11B, 11C, 11F, and 11G which are located intermediately between the middle and the both ends. Thereby, the heat release function by the window region 19 is improved from the middle toward the both ends. Thus, in this embodiment, the wavelength elongation of the beam generated due to the structure substrate 10 is moderated, and the degree of the moderation is increased from the beams in the middle toward the beams at the both ends in proportion to the size of the window region 19. Thus, it is possible to obtain the oscillation wavelengths substantially uniform over all the beams.

Figure 4:
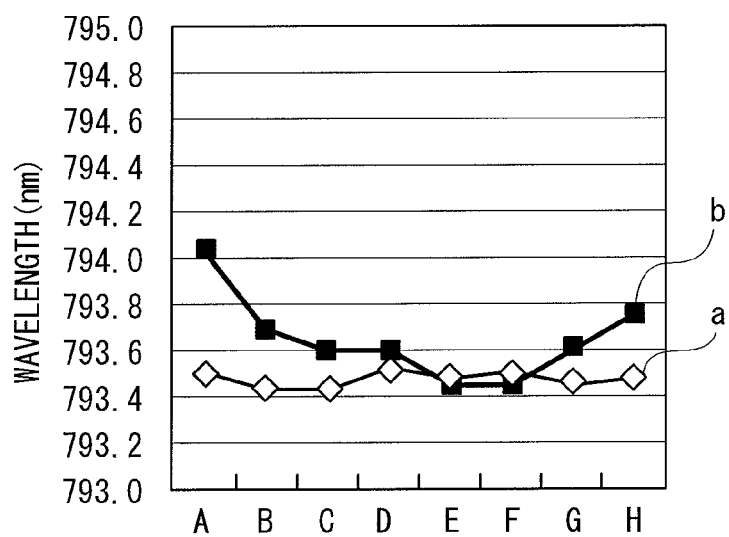
FIG. 4 is a characteristics view illustrating the relationship between a beam position and a wavelength in the semiconductor laser device of FIG. 1 in comparison with an example of the existing technique.
Figure 11:
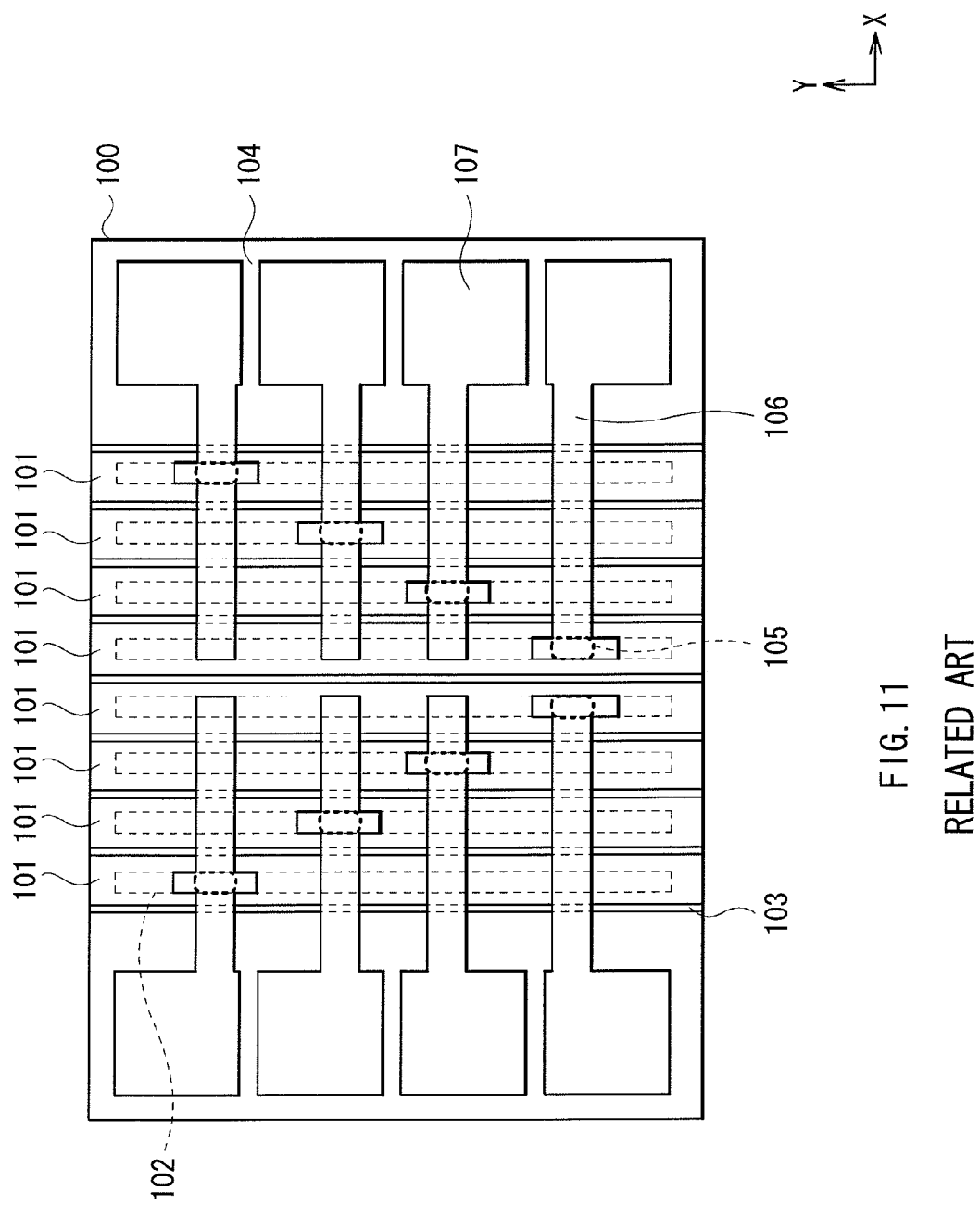
FIG. 11 is a plan view illustrating the structure of an existing semiconductor laser device.

FIG. 4 illustrates the relationship between beam positions A to H and the wavelength according to this embodiment in comparison with an example of the existing technique (FIG. 11). The beam positions A to H correspond to the positions of the ridges 11A to 11H, "a" indicates results of the semiconductor laser device 1 of this embodiment, and "b" indicates results of the example of the existing technique, respectively. According to this, it is fount that the effect of suppressing the wavelength elongation is large as the position is close to the both ends. Therefore, in the case where the semiconductor laser device 1 is applied to, for example, a laser beam printer, the stable printing operation is performed.

2. First Modification

The position, the size, the shape, and the like of the pattern of the window region 19 are not limited to those of the first embodiment, and they are arbitrary as long as the heat release function by the window region 19 is changed in steps for each laser beam. FIG. 5 illustrates an example of that case.

3. Second Modification

Figure 6:
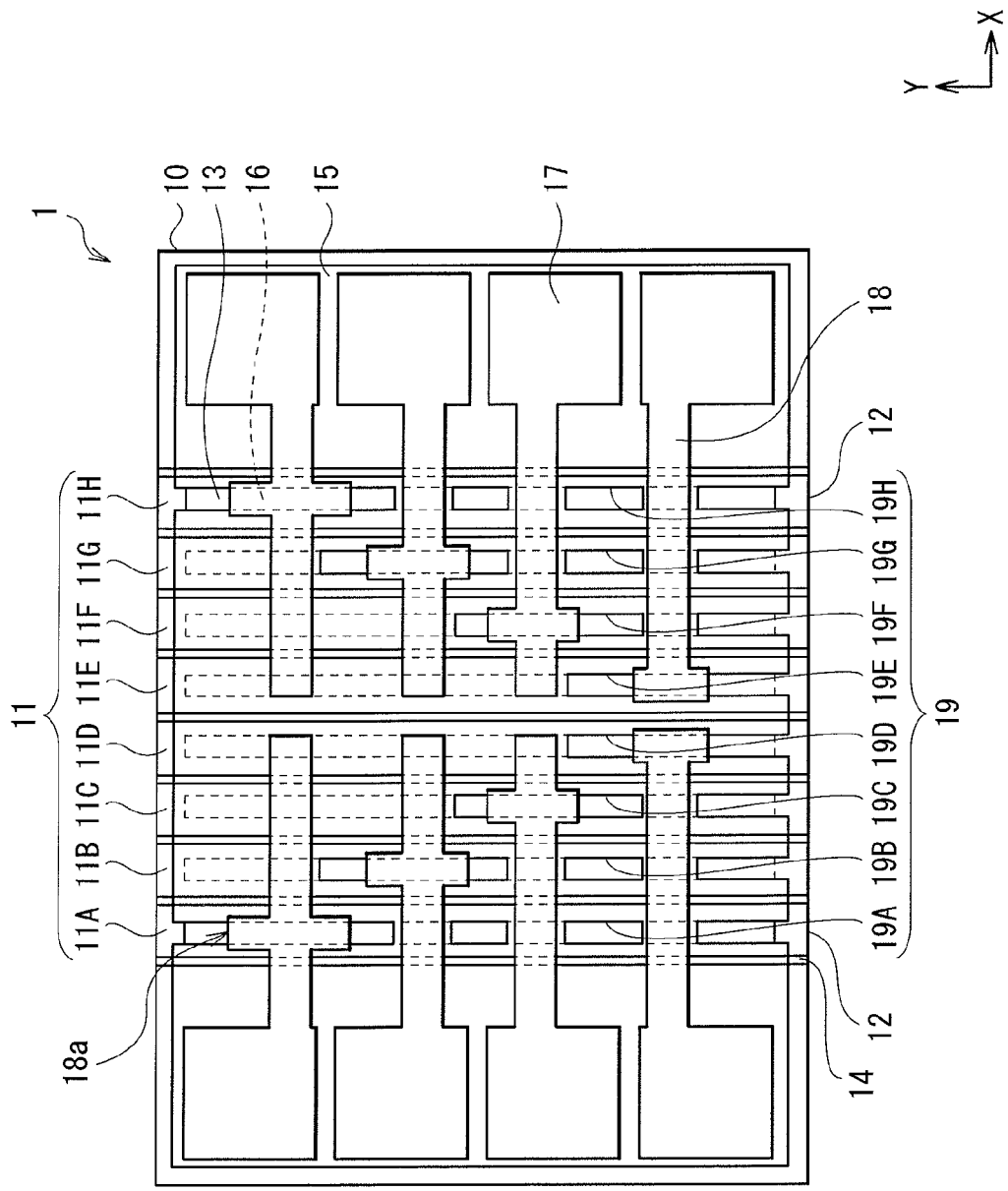
FIG. 6 is a plan view according to a second modification.

FIG. 6 illustrates a modification of the pattern of the wiring layer 18, and a wing element 18a in the wiring layer 18 is provided in the portion in contact with the upper electrode 13, thereby forming a cross shape. Thereby, it is possible to further ensure the contact area of the wiring layer 18 and the upper electrode 13.

4. Second Embodiment

Figure 7:
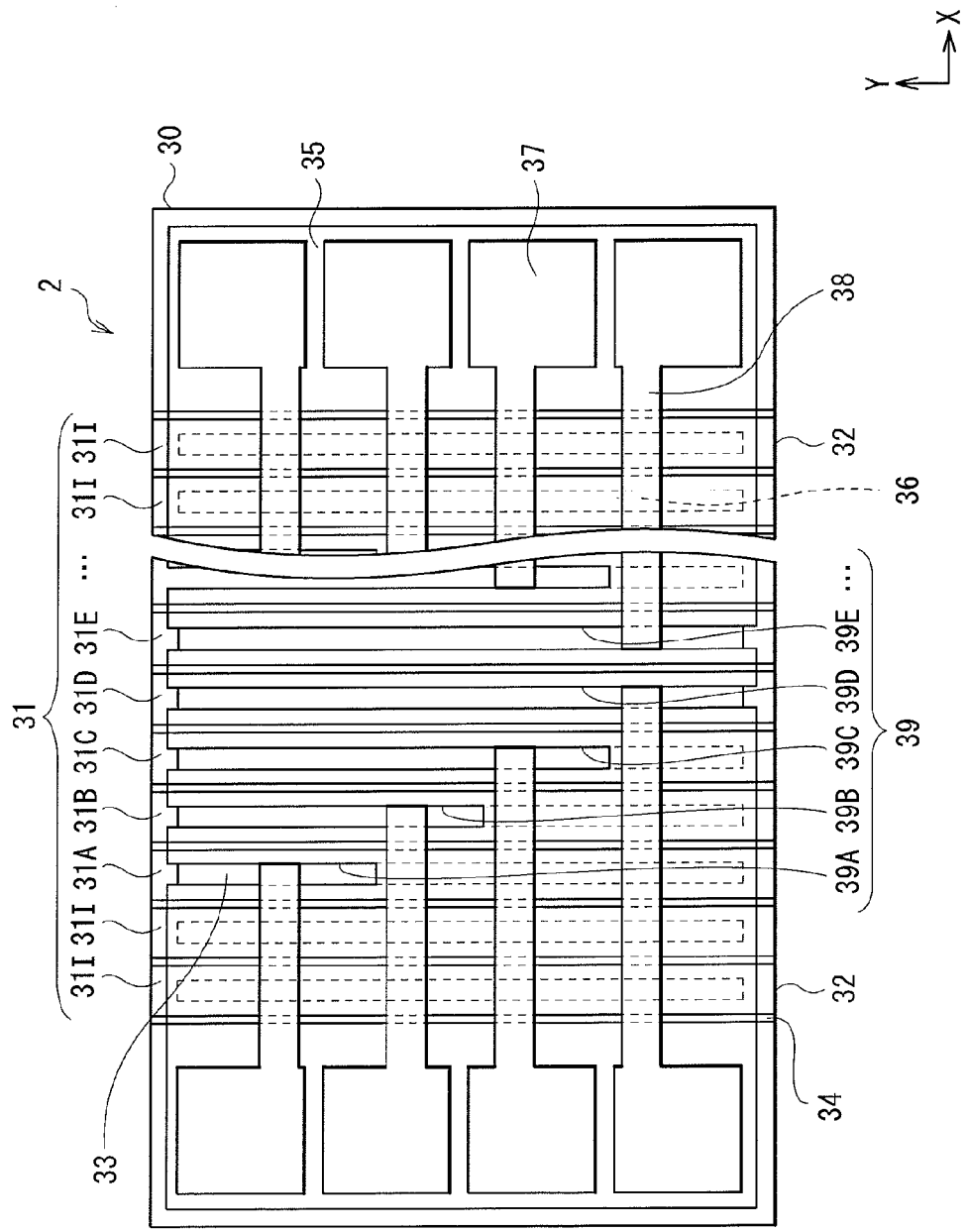
FIG. 7 is a plan view of the semiconductor laser device according to a second embodiment of the present invention.

FIG. 7 illustrates an example of the planar structure of a semiconductor laser device 2 according to a second embodiment of the present invention. The semiconductor laser device 2 has a typical edge-emitting (laser diode) structure.

The semiconductor laser device 2 includes a laser structure in each of a plurality (here, eight) of ridges 31 (31A to 31H) provided on a substrate 30. In FIG. 7, the ridges 31A to 31H extend in the strip shapes in the y-axis direction, and are arranged in parallel to each other. Light emitting sections (emitters) 32 are provided in the ridges 31A to 31H, respectively, and each of the light emitting sections emits the laser beam from its end face in the extending direction. Although dummy ridges 31I having the same structures as those of the ridges 31A to 31H are provided on the both sides of the ridges 31A to 31H, the dummy ridges 31I do not contribute to the light emission. An upper electrode 33 (first electrode) is provided on the top face of each ridge 31. The upper electrode 33 corresponds to one electrode (here, the p-side electrode) of the pair of electrodes (the p-side electrode and the n-side electrode) with respect to the light emitting section 32. The ridges 31A to 31H are isolated from each other by the isolating grooves 34. Here, in the eight ridges 31, for example, the two ridges 31D and 31E correspond to "ridges in the middle", respectively, and the ridges 31A and 31H correspond to "ridges on the both ends", respectively.

The upper electrodes 33 are covered with an insulating film 35. In the insulating film 35, contact apertures 36 are provided for the upper electrodes 33, respectively, so as to make the electrical connection between wiring layers 38 which will be described later, and the upper electrodes 33. At both sides of the surface of the substrate 30, a pair of four pad electrodes 37 (second electrodes) in parallel, that is, a total of the eight pad electrodes 37 are aligned in the extending direction of the ridges 31 with the plurality of ridges 31 in between. On the insulating film 35, correspondingly to the pad electrodes 37, the plurality of wiring layers 38 are aligned in the direction orthogonal to the upper electrode 33, respectively. By the wiring layers 38, the upper electrodes 33, and the pad electrodes 37 corresponding to the upper electrodes 33 are electrically connected. The wiring layers 38 are bridged above the isolating grooves 34. The wiring layers 38 and the upper electrodes 33 are in contact with each other through the contact apertures 36 which are provided in the insulating film 35. Here, although the contact aperture 36 is formed of an aperture pattern integrated with a window region 39 which will be described later, the contact aperture 36 and the window region 39 may be formed separately from each other without being integrated with each other. The structure described above is substantially the same as that of the first embodiment.

Also in this embodiment, in the insulating film 35, a plurality of window regions 39 (39A to 39H) are provided for the ridges 31A to 31H, respectively, so as to face the upper electrodes 33. In the window regions 39, the window regions 39D and 39E of the ridges 31D and 31E in the middle are relatively wide, and the window regions 39A and 39H of the ridges 31A and 31H at the both ends are relatively narrow. Further, the area of the window region 39 is sequentially increased in steps from the ridges 31 at the both ends toward the ridges 31 in the middle. The area of the window region 39 depends on the total area of the plurality of window patterns provided for each ridge 31, in the same manner as the first embodiment.

As described above, in the multi-beam laser device of the narrow pitch type described above, in the case where light emission is performed in the plurality of emitters at the same time, each beam is influenced by heat from other beams. Therefore, in particular, there is the issue that the temperature of the beam is high in the ridges 31D and 31E in the middle, and the oscillation wavelength becomes long. In view of the foregoing, in this embodiment, on the contrary to the first embodiment in which the structure substrate is used, the area of the window region 39 is set to be wide in steps from the ridges 31 at the both ends toward the ridges 31 in the middle.

Figure 8:
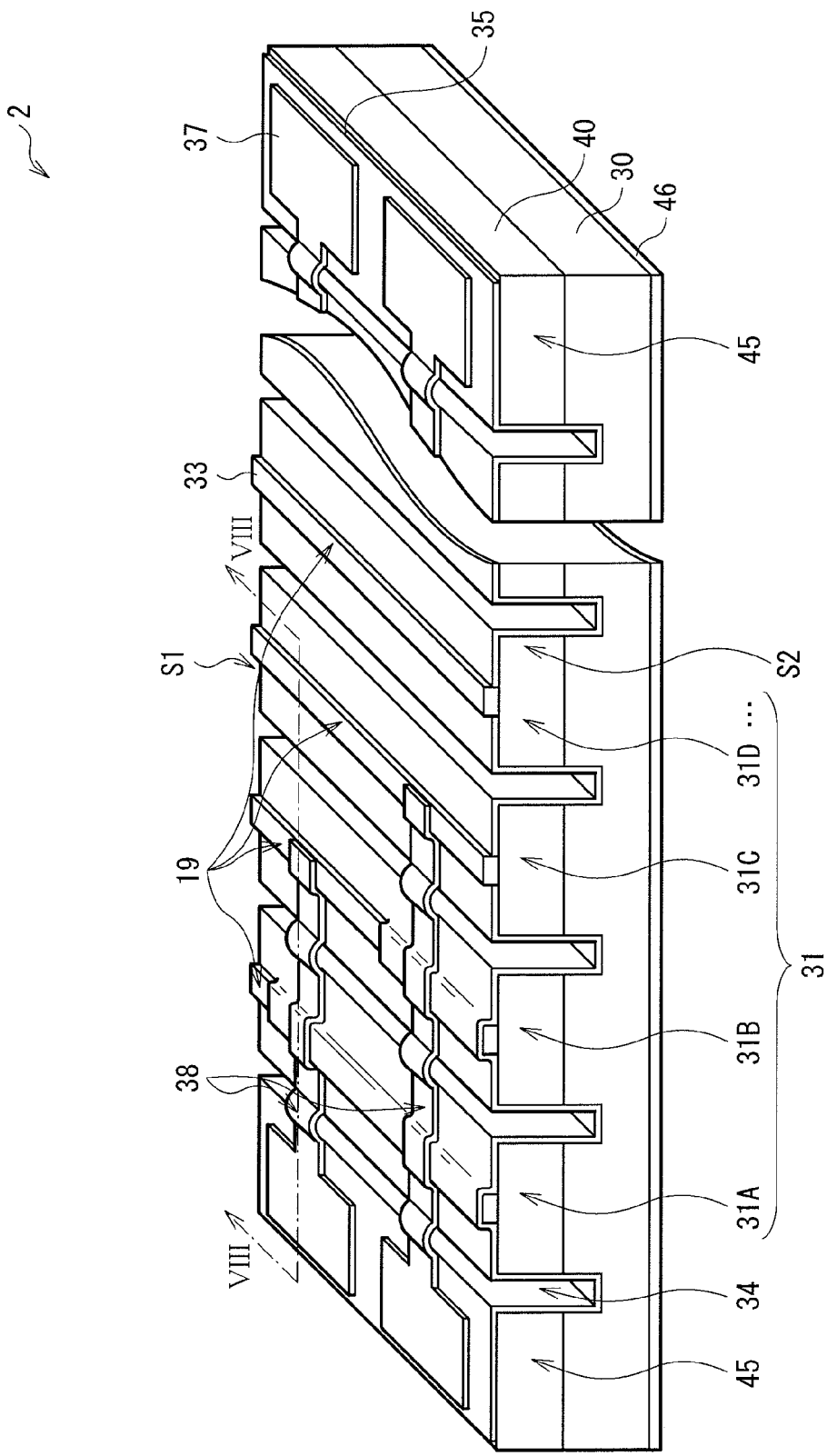
FIG. 8 is a perspective view illustrating a part of the semiconductor laser device of FIG. 6.
Figure 9:
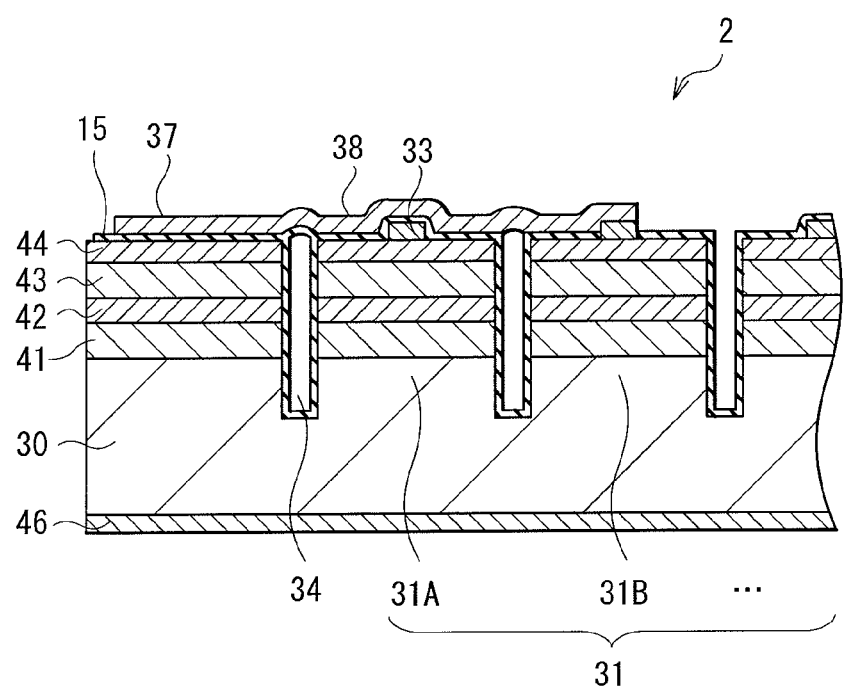
FIG. 9 is a view illustrating the cross-sectional structure along line VIII-VIII of FIG. 7.

FIG. 8 perspectively illustrates an example of the schematic structure of the semiconductor laser device 2, and FIG. 9 illustrates the cross-sectional structure along line VIII-VIII of FIG. 8. In FIG. 8, the dummy ridges 31I illustrated in FIG. 7 are omitted. The semiconductor laser device 2 includes a semiconductor layer 40 on the substrate 30. In the semiconductor layer 40, a lower cladding layer 41, an active layer 42, an upper cladding layer 43, and a contact layer 44 are included in this order from the substrate 30 side. Although not illustrated in the figure, layers (for example, a buffer layer and a guide layer) other than the above-described layers may be further provided in the semiconductor layer 40.

At the both ends in the alignment direction of the ridges 31, strip-shaped pedestals 45 having the heights equal to those of the ridges 31 are provided. On the pedestal 45, the above-described pad electrode 37 is provided. The semiconductor layer 40 is spatially divided into a plurality of parts by the isolating groove 34, in the same manner as the case of the isolating groove 14 in the first embodiment.

The ridge 31 includes at least the top part of the lower cladding layer 41, the active layer 42, the upper cladding layer 43, and the contact layer 44, and the light emitting section 32 is composed of these layers. In FIG. 9, the case where the ridge 31 includes the top part of the substrate 30, the lower cladding layer 41, the active layer 42, the upper cladding layer 43, and the contact layer 44 is illustrated. The upper electrode 33 is electrically connected to the contact layer 44 and the upper cladding layer 43.

The substrate 30 is composed of, for example, p-type GaAs. Examples of the p-type impurity include magnesium (Mg), and zinc (Zn). The lower cladding layer 41 is composed of, for example, p-type AlGaAs. The active layer 42 is composed of, for example, undoped AlGaAs. In the active layer 42, a strip-shaped region including a region facing the upper electrode 33 is a light emitting region. The light emitting region corresponds to a current injection region into which a current from the upper electrode 33 is injected. The upper cladding layer 43 is composed of, for example, n-type AlGaAs, and the contact layer 44 is composed of, for example, n-type GaAs. Examples of the n-type impurity include silicon (Si) or selenium (Se).

The width (width in the direction orthogonal to the extending direction of the isolating groove 34) of the isolating groove 34 is narrower than the width (width in the direction orthogonal to the extending direction (resonator direction) of the ridge 31) of the ridge 31. Specifically, when the width of the ridge 31 is approximately several tens of μm (for example, 30 μm), the width of the isolating groove 34 is approximately several μm (for example, 3 μm). That is, the semiconductor laser device 2 of this embodiment is a narrow-pitch type laser having the beam pitch of approximately several tens of μm.

On the rear face of the substrate 30, the lower electrode 46 is provided. The lower electrode 46 is, for example, formed on the whole rear face, and electrically connected to the substrate 30.

The upper electrode 33, the pad electrode 37, and the wiring layer 38 are, for example, composed by stacking an alloy of gold (Au) and germanium (Ge), nickel (Ni), and gold (Au) in this order from the structure substrate 30 side. The upper electrode 33, the pad electrode 37, and the wiring layer 38 may have a stacked structure of materials other than the materials described above. The upper electrode 33, the pad electrode 37, and the wiring layer 38 may be composed of the same materials, or may be composed of materials different from each other. The insulating film 35 is composed of, for example, SiN, $SiO_2$, SiON, $Al_2O_3$, or MN. The lower electrode 46 is, for example, composed by stacking titanium (Ti), platinum (Pt), and gold (Au) in this order from the top face side of the ridges 31.

Next, with reference to FIGS. 7 to 9, an example of a method of manufacturing the semiconductor laser device 2 will be described while focusing on the formation process of the window region 39 in the insulating film 35.

First, after the plurality of ridges 31 (31A to 31H) including the emitters are formed on the substrate 30, the upper electrode 33 is formed on each of the ridges 31A to 31H through the use of evaporation method. Next, after electrically isolating between the emitters by providing the isolating grooves 34 between these ridges 31, the insulating film 35 is, for example, formed on the whole surface through the use of evaporation method.

Next, for example, the contact aperture 36 for the contact of the upper electrode 33, and the wiring layer 38 is formed in the insulating film 35 through the use of etching by utilizing a resist mask, and the window regions 39 (39A to 39H) for heat release are formed at the same time. Here, in the window regions 39A to 39H, as described above, the window regions 39D and 39E of the ridges 31D and 31E in the middle are relatively wide, and the window regions 39A and 39H of the ridges 31A and 31H at the both ends are relatively narrow. After that, the metal layer made of the above-described material is formed on the whole surface through the use of evaporation method or the like, and the pad electrode 37 and the wiring layer 38 are formed by patterning the metal layer. Meanwhile, on the rear face of the substrate 30, the lower electrode 46 is formed. In this manner, the semiconductor laser device 2 of this embodiment is completed.

In the semiconductor laser device 2 of this embodiment, when a predetermined voltage is applied between the upper electrode 33 and the lower electrode 46 in each light emitting section 32, a current is injected into the current injection region (light emitting region) of the active layer 42, and thereby light emission is generated by recombination of an electron and a hole. This light is reflected by the pair of the front end face S1 and the rear end face S2, and the laser oscillation is generated at a predetermined wavelength. The light is emitted outside as a laser beam from the front end face S1 of each ridge 31.

Here, in this embodiment, on the contrary to the first embodiment, the area of the window region 39 for heat release provided in the insulating film 35 is relatively wide in the ridges 31D and 31E in the middle, and is narrow in the ridges 31A and 31H at the both ends. Correspondingly, the area of the window region is changed in steps in the ridges 31B, 31C, 31F, and 31G which are located intermediately between the middle and the both ends. Thereby, the heat release function by the window region 39 is increased from the both ends toward the middle. Thus, in this embodiment, the wavelength elongation of the beam generated due to the narrow pitch is moderated, and the degree of the moderation is increased from the beams at the both ends toward the beams in the middle in proportion to the size of the window region 39. Thus, it is possible to obtain the oscillation wavelengths substantially uniform over all the beams. That is, even in the case where the semiconductor laser device 2 is applied to a laser beam printer or the like, the stable printing operation is performed.

Hereinbefore, although the present invention has been described with reference to the first embodiment, the second embodiment, and the modifications thereof, the present invention is not limited to the foregoing embodiments and the like, and various modifications may be made.

For example, in the foregoing embodiments and the like, although the example where the pedestals 27 (45) are provided on both sides of the ridges 11 (31) has been described, the pedestals 27 (45) may be omitted. In that case, the pad electrodes 17 (37) may be formed in a region exposed by omitting the pedestals in the top face of the structure substrate 10 (substrate 30).

Figure 10:
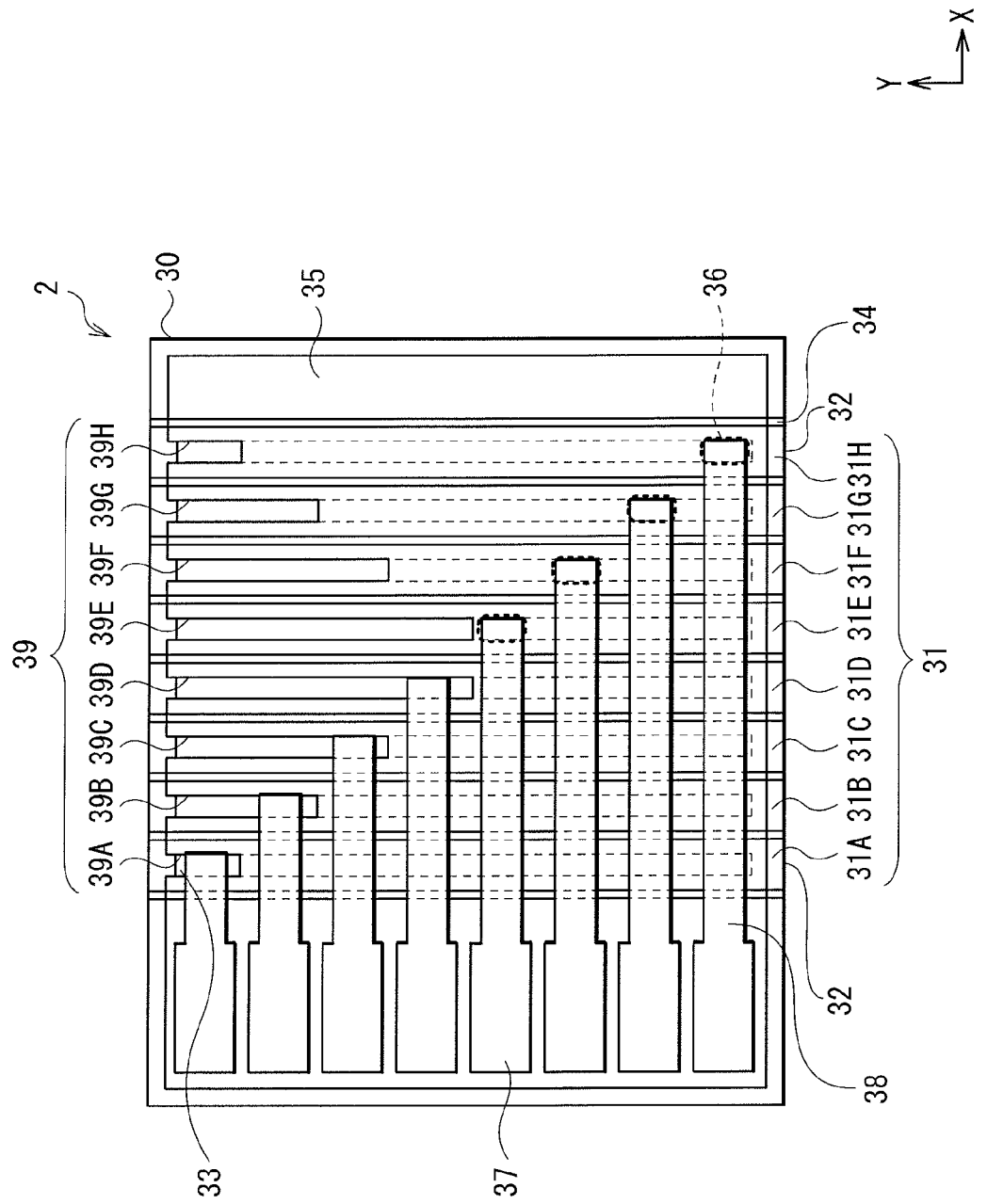
FIG. 10 is a plan view illustrating a third modification.

In the foregoing embodiments, although the plurality of pad electrodes 17 (37) are divided into two groups and arranged on the both sides of the ridges 11 (31), all the pad electrodes 17 (37) may be arranged only on one side as illustrated in FIG. 10 (third modification).

In the foregoing embodiments, although one upper electrode 13 (33) corresponds to one pad electrode 17 (37), a plurality of the upper electrodes 13 (33) may be electrically connected to one pad electrode 17 (37), that is, the plurality of emitters may be driven at the same time by one pad electrode. Further, needless to say, the semiconductor laser devices 1 and 2 are not limitedly applied to the laser printer, but are applicable to other electric devices.

In the foregoing embodiments and the like, although the present invention has been described with reference to the example of the AlGaAs compound semiconductor laser device, the present invention is applicable to other compound semiconductor laser devices, for example, a red semiconductor laser device of AlGaInP, GaInAsP, or the like, a gallium nitride semiconductor laser device of GaInN, AlGaInN, or the like, and a II-VI semiconductor laser device of ZnCdMgSSeTe or the like. Further, the present invention is applicable to a semiconductor laser device of AlGaAs, InGaAs, InP, GaInAsNP, or the like, in which the oscillation wavelength is not limited to a visible range.

In addition, in the foregoing embodiments, although the area of the window region 19 (39) provided in the insulating film 15 (35) is set to be wide (first embodiment), or set to be narrow (second embodiment) in steps from the middle toward the both ends, it may not necessary for the whole intermediate portion located between the middle and the both ends to be changed in steps. For example, in a part of the intermediate portion, the areas of the window regions may be equal to each other between the two ridges 11 adjacent to each other, and between the two ridges 31 adjacent to each other. The point is that the area of the window region may not be proportionally changed in a strict sense, as long as it may suppress the wavelength elongation of the beam generated due to the structural matter such as the SDH structure, or the narrow pitch to the degree that issues are not generated. Further, in the multi-beam laser device including at least two light emitting sections (emitters), it is enough when the areas of the window regions (that is, the exposure areas of the upper electrode) are different from each other in accordance with the degree of the wavelength elongation generated due to the beam positions.

In the present invention, the expression "the areas of the window regions are different from each other" includes the case where the smallest area of the areas of the window regions is zero (that is, there is no window region). For example, since the ridges 11D and 11E in the middle in the first embodiment, and the ridges 31A and 31H at the both ends in the second embodiment have the lowest risk of the wavelength elongation in comparison with the ridges in other positions, it is possible not to provide the window regions for the ridges 11D and 11E, and the ridges 31A and 31H.

Further, in the foregoing embodiments, although the plurality of beams are set to be uniform by suppressing the wavelength elongation, it is also possible to shift the oscillation wavelengths between the beams by adjusting the size of the window region.

The present application contains subject matter related to that disclosed in Japanese Priority Patent Application JP 2009-159041 filed in the Japan Patent Office on Jul. 3, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof

What is claimed is:

1. A semiconductor laser device comprising:
   a plurality of light emitting sections arranged in strip shapes in parallel, and emitting beams from end faces in an extending direction;
   a plurality of first electrodes arranged along top faces of the light emitting sections, respectively;
   an insulating film covering the plurality of first electrodes, and including contact apertures corresponding to the first electrodes, respectively;
   a plurality of second electrodes arranged in positions different from those of the plurality of light emitting sections, correspondingly to the first electrodes;
   a plurality of wiring layers arranged on the insulating layer, and electrically connecting the second electrodes and the corresponding first electrodes through the contact apertures, respectively; and
   a plurality of window regions arranged in correspondence to the light emitting sections, the plurality of window regions defining openings in the insulating film so as to expose the first electrodes, and including at least two window regions having areas different from each other based on a degree of wavelength elongation of a beam in a corresponding light emitting section.

2. The semiconductor laser device according to claim 1, wherein three or more of the light emitting sections are arranged in parallel, and the areas of the window regions are relatively narrow in the light emitting sections in middle, and are relatively wide in the light emitting sections at both end sides in the plurality of light emitting sections.

3. The semiconductor laser device according to claim 2, wherein the widths and the heights of active layers in the light emitting sections at the both ends, and those of active layers in the light emitting sections in the middle are different.

4. The semiconductor laser device according to claim 1, wherein three or more of the light emitting sections are arranged in parallel, and the areas of the window regions are relatively narrow in the light emitting sections at the both end sides, and are relatively wide in the light emitting sections in the middle in the plurality of light emitting sections.

5. The semiconductor laser device according to claim 4, wherein the widths and the heights of the active layers are equal to each other in the plurality of light emitting sections.

6. The semiconductor layer device according to claim 1, wherein the light emitting sections are provided for a plurality of ridges arranged in strip shapes in parallel, respectively, with isolating grooves in between.

7. The semiconductor laser device according to claim 6, wherein the wiring layers are bridged above the isolating grooves.

8. The semiconductor laser device according to claim 7, wherein the plurality of second electrodes are divided into two groups, and arranged in two regions so as to sandwich the ridges and the isolating grooves from both sides.

9. The semiconductor laser device according to claim 8, wherein all of the plurality of second electrodes are arranged in one region of the two regions sandwiching the ridges and the isolating grooves from the both sides.

* * * * *